United States Patent [19]

Wittkower

[11] Patent Number: 5,080,730

[45] Date of Patent: Jan. 14, 1992

[54] IMPLANTATION PROFILE CONTROL WITH SURFACE SPUTTERING

[75] Inventor: Andrew B. Wittkower, Rockport, Mass.

[73] Assignee: IBIS Technology Corporation, Danvers, Mass.

[21] Appl. No.: 342,484

[22] Filed: Apr. 24, 1989

[51] Int. Cl.$^5$ .......................................... H01L 21/265
[52] U.S. Cl. ........................................ 148/33; 437/24; 437/26; 437/62; 148/DIG. 158
[58] Field of Search ........................ 437/24, 26, 61, 62; 148/33, DIG. 158; 204/192.37, 192.25; 250/492.21

[56] References Cited

U.S. PATENT DOCUMENTS

| | | | |
|---|---|---|---|
| 4,033,788 | 7/1977 | Hunsperger et al. | 148/1.5 |
| 4,241,359 | 12/1980 | Izumi et al. | 357/49 |
| 4,394,180 | 7/1983 | Dearnaley et al. | 148/1.5 |
| 4,452,646 | 6/1984 | Zuleeg | 148/1.5 |
| 4,704,302 | 11/1987 | Bruel et al. | 427/38 |

FOREIGN PATENT DOCUMENTS

| | | | |
|---|---|---|---|
| 2581795 | 11/1986 | France | 437/24 |
| 0031971 | 3/1978 | Japan | 437/61 |
| 0059090 | 5/1979 | Japan | 437/24 |
| 0208851 | 11/1984 | Japan | 437/62 |

OTHER PUBLICATIONS

"Sputter Etch Removal Rates of Insulators, Semiconductors, and Conductors", Larry L. Fritz, Solid State Technology, Dec. 1971, pp. 43-48.

"Nucleation and Growth of SiO$_2$ Precipitates in SOI/SIMOX Related Materials-Dependence Upon Damage and Atomic Oxygen Profiles", Nuclear instruments and methods in Physics research, Section B (Beam interactions with materials and Atoms) Mar. 1989, vol. B39, No. 1-4, Hemment et al., pp. 210-214.

Primary Examiner—Olik Chaudhuri
Assistant Examiner—Ourmafd Ojan
Attorney, Agent, or Firm—Weingarten, Schurgin, Gagnebin & Hayes

[57] ABSTRACT

An ion implantation process for producing a buried insulating layer of silicon dioxide in a silicon substrate which takes advantage of the effects of surface erosion and sputtering inherent to the ion implantation process. The process allows the production of an insulating layer buried within a silicon semiconductor wherein the width of the insulating layer can be contoured by controlling the beam energy during implantation.

8 Claims, 3 Drawing Sheets

IMPLANTATION PROFILE CONTROL WITH SURFACE SPUTTERING

FIELD OF THE INVENTION

This invention relates to a process used in semiconductor production and, more particularly, relates to a process for contouring an insulating layer formed in a semiconductor substrate by ion implantation.

BACKGROUND OF THE INVENTION

Ion implantation is a process in which atomic particles are introduced into a substrate for the purpose of changing the electrical or chemical properties of the substrate. This process uses high energies to accelerate ions which enter the surface and are slowed down by electronic or nuclear collisions with the substrate atoms, and come to rest some small distance below the surface. Modern semiconductor technology is one field in which ion implantation is particularly useful and wherein implanted ions are used to alter the conductivity of the base material as well as to form buried insulating layers. One object, in the case of buried insulating layers, is the minimization of the volume of electrically active semiconductor material to reduce parasitic effects such as device-to-device effects (known as latch-up), leakage capacitance, resistance, etc. and to minimize sensitivity to radiation.

In the early 1980's, a process known as separation by implanted oxygen or SIMOX was developed in which a high-dose of oxygen ions are implanted into a solid monocrystalline silicon substrate, making it possible to form a buried layer of silicon dioxide $SiO_2$). The resultant layer dielectrically isolates circuit elements, enabling the fabrication of smaller, closer and faster circuits which are immune to the noted parasitic and radiation effects which cause latch-up and add to circuit capacitance.

Using the SIMOX process, oxygen ions are implanted into silicon at a constant beam energy between 150 and 200 keV at a dose of approximately $1.6 \times 10^{18}$ ions/cm$^2$. After implantation, the material is annealed to form the chemically bonded silicon dioxide. A typical anneal cycle involves heating the substrate to approximately 1300 degrees for six hours. This annealing phase redistributes the oxygen ions which are implanted in a roughly Gaussian profile with respect to the most probable depth (range) such that the silicon/silicon dioxide boundary on either side of the silicon dioxide layer becomes markedly more abrupt, thus forming a sharp and well-defined region centered at the most probable depth.

During implantation, incoming high-speed oxygen ions sputter silicon ions from the surface resulting in surface erosion. Due to the effect of this surface erosion, the original surface of the silicon layer is displaced, causing ions implanted toward the end of the implant cycle to come to rest at a depth deeper than ions implanted at the start of the implant cycle. In practice, this erosion effect is magnified when a surface layer of silicon dioxide is provided to protect surface features because silicon dioxide erodes more rapidly than silicon during implantation. As a result of the variation in implantation depth of oxygen ions, a broader band of silicon oxide layer is created. This, in turn, increases the minimal acceptable dose of oxygen ions required to create the silicon dioxide layer, thereby causing even greater surface damage and longer processing times.

SUMMARY OF THE INVENTION

The present invention relates to a process for producing a buried insulating layer, typically of silicon dioxide ($SiO_2$) or silicon nitride ($Si_3N_4$), within a silicon substrate in a manner which advantageously regulates the implantation energies in response to the surface erosion to produce a thinner, low dosage insulating layer suitable for typical low voltage use, or a thicker, more even layer in a semiconductor substrate wherein the thickness of the buried insulative layer is determined by controlling the beam energy used to implant ions into the silicon layer as a function of surface erosion. The silicon layer erodes at a rate which is dependent on the density of the ions being implanted into the silicon. The peak ion distribution is maintained at a constant position by reducing the beam energy and corresponding penetration by an amount corresponding to the depth of erosion. This more rapidly achieves the ion density required to fully form an oxide barrier with less exposure of the substrate to ion implantation effects. The oxide barrier thus formed, while thinner, provides protection for most semiconductor applications which are typically low voltage applications.

Conversely, by increasing the beam energy over the implantation period, the peak of the ion implantation distribution occurs at progressively deeper depths, advantageously benefited by the surface erosion which allows the distribution to shift naturally. In this case, the oxide barrier is formed over a greater depth to provide additional insulative protection in high voltage applications.

The process for producing a buried insulating layer according to the present invention is advantageous for producing an active component of an integrated circuit positioned on crystalline silicon material above an insulating layer. This technique produces a radiation hardened material and also dielectrically isolates circuit elements enabling smaller, closer and faster circuits to be fabricated with a marked reduction in stray capacitance and an increase in the operating speed of the circuits. Additionally, the material shows great promise for mixed application such as BI-CMOS circuits which combine power and logic on the same chip.

BRIEF DESCRIPTION OF THE DRAWINGS

The invention will be more fully understood from the following detailed description taken in conjunction with the accompanying drawings in which.

DETAILED DESCRIPTION OF THE INVENTION

Figure 1A:
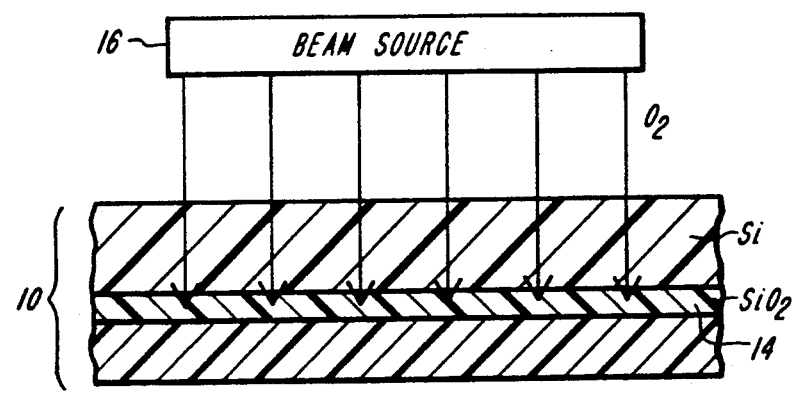
Figs. 1A to 1B are diagrammatic representations showing a prior art ion implantation process for producing a buried insulating layer in a semiconductor substrate at different stages in the process.

The present invention contemplates energy control during oxygen or nitrogen ion implantation to produce a narrowed or a widened insulating layer in a silicon substrate. According to the prior art, as shown in FIG. 1A, an initially uniform silicon layer 10 is bombarded with oxygen ions generated by a beam source 16 wherein the oxygen ions travel through the silicon crystal structure 10 and come to rest in the crystal matrix of silicon atoms. Since the purpose of the implantation process is to create a buried layer of silicon dioxide ($SiO_2$), two oxygen atoms are implanted for each silicon atom to achieve the appropriate chemical structure. The oxygen ions come to rest as a broadened band 14 buried in the silicon in a roughly Gaussian distribution with respect to depth where the depth is dependent upon the ion beam energy used to project the oxygen atoms into the silicon layer. Annealing subsequently forms a silicon dioxide layer having sharpened boundaries.

Figure 1B:
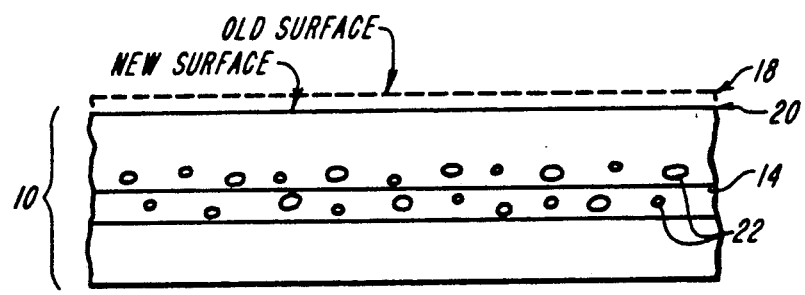

FIG. 1B shows the surface erosion resulting from the oxygen implantation on the silicon layer 10. The dotted line 18 represents the original top face of the silicon layer before ion implantation. As ions are bombarded against the surface of the silicon, the top face 18 of the silicon layer 12 is eroded or sputtered such that the top of the silicon layer progressively retreats toward a lower level 20. The effect of the erosion is that ions implanted in the course of an implant cycle come to rest at progressively deeper depths within the silicon layer and farther from the original top face 18 than the ions implanted at the start of the implant cycle.

FIG. 1B also shows an additional characteristic of the prior art ion implantation process in that small islands 22 of silicon dioxide may be formed in layer 14 and just above due to ions which are deposited in the tail of the Gaussian distribution to form a chemical bond outside of the sharpened Gaussian distribution formed during annealing. This is an undesirable phenomenon which alters the electrical conductivity characteristics of the silicon semiconductor layer.

Figure 1C:
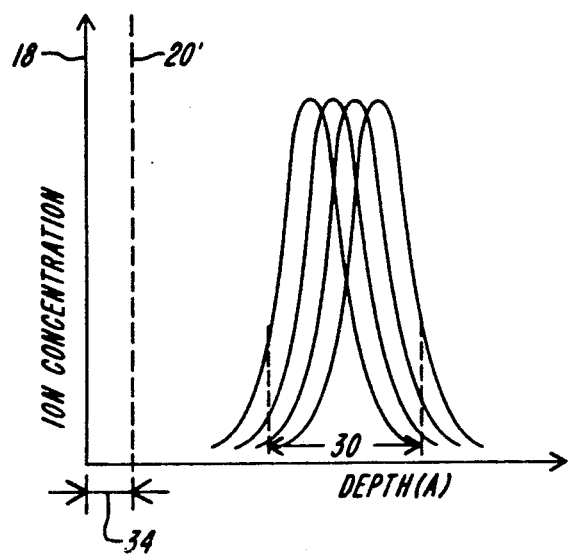
FIG. 1C is a graph of ion concentration with respect to the depth of deposition according to the prior art.

FIG. 1C shows the broadened Gaussian distribution of oxygen ions that would result from an ion implantation using constant. Under this prior art arrangement, it can be seen that the ion concentration is distributed over a broad Gaussian depth distribution 30.

In summary, the net effect of this surface erosion is that the distribution of ions is spread over a wide range which causes the buried silicon dioxide layer to be thicker and also creates islands of silicon dioxide deposits outside of the insulating layer to be formed. Additionally, the minimum acceptable dose of ions necessary to create a quality insulating layer is high since the chemical bonding of the insulating layer must be achieved over a broader range.

The present invention is adapted to controllably reduce or increase the beam energy during ion implantation. Such controlled variation in beam energy permits specific contouring of the width of the buried insulator layer band. Moreover, by compensating for the known effects of surface erosion, greater regulation of the implantation process is achieved.

Figure 2A:
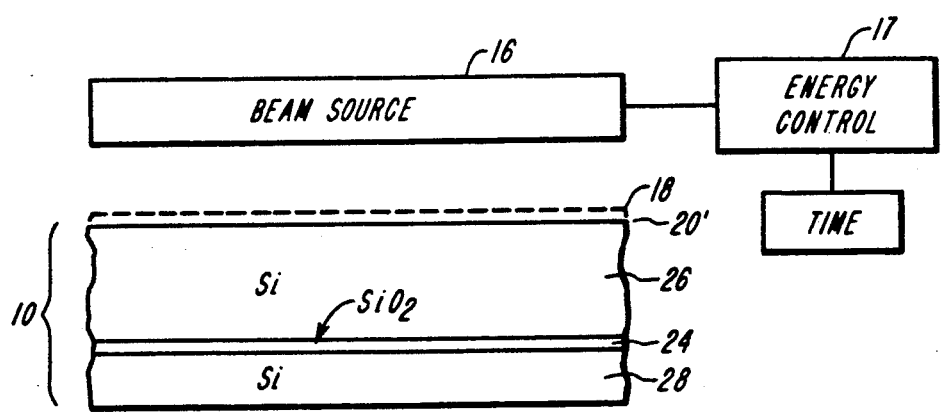
FIG. 2A is a diagrammatic representation of a modified ion implantation process for producing a narrowed buried insulating layer according to a first embodiment of the invention.
Figure 2B:
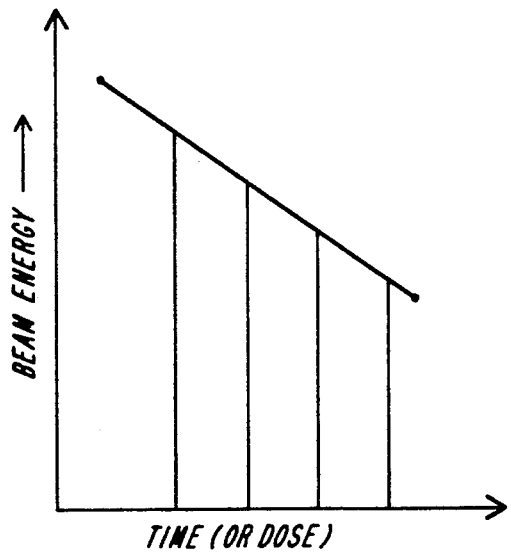
FIG. 2B is an energy profile diagram showing the energy tapering according to the first embodiment of the invention.

FIG. 2A is a diagramatic sectional view of a first embodiment of the present invention wherein the applied beam energy from source 16 is controllably decreased by an energy control 17 to decrease the implantation depth such that the peak of the ion distribution is maintained at the same depth despite the existence of surface erosion. Thus, after annealing, a buried 9 silicon dioxide layer 24 forms as a thin strata of insulating material which dielectrically separates the former silicon semiconductor 10 into two newly formed layers 28 and 26. The energy decrease with time and ion sputtering is shown in FIG. 2B.

Figure 3A:
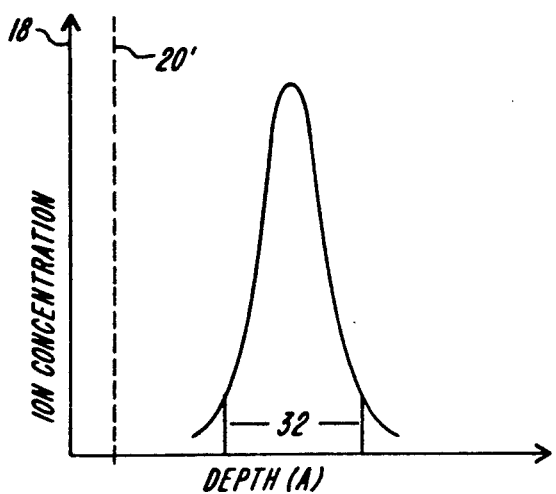
FIGS. 3A and 3B are graphs showing the Gaussian distribution of the ions with respect to the distance from the top face of the silicon layer in the first embodiment of the invention.
Figure 3B:
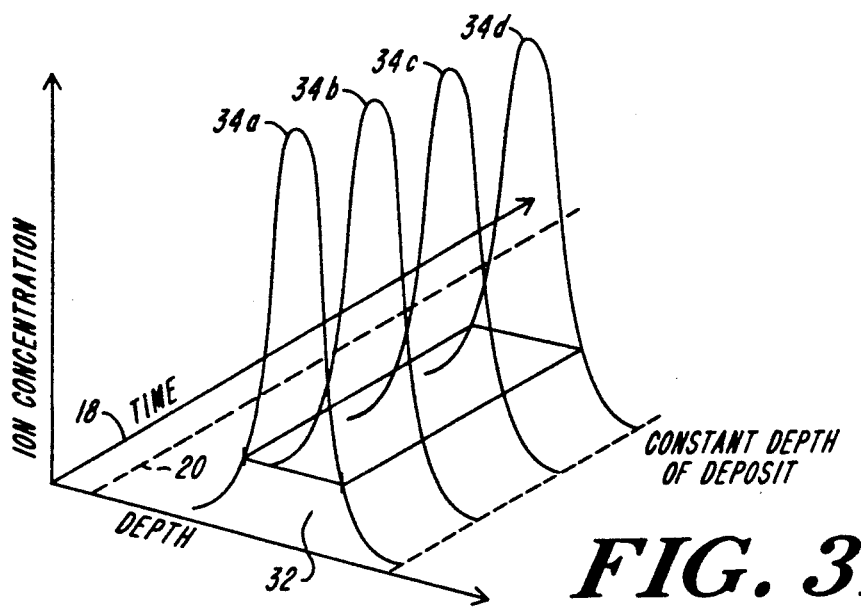

FIG. 3A shows the effect of reducing beam energy with time, as surface 18 is eroded to a surface 20'. In FIG. 3B a three dimensional graph shows the roughly Gaussian distribution profiles 34a, b, c, d which represent the ion concentration at different times as the beam energy is decreased during the implantation cycle. By using ion beam energy control to perform this energy reduction, it can be seen that the peak ion concentration can be limited to a very narrow range 32 within the silicon substrate as the surface 18 gradually recedes due to erosion thereof.

As an illustration of the first embodiment of the present invention, a beam energy of 150 keV will erode silicon at a rate of approximately $34/10^{17}$ ions/cm$^2$. Further, it is inherent in this ion implantation process that ions are implanted at a peak depth of approximately 19 A/keV. Thus, the depth of the peak of the ion distribution can be maintained at a constant level by reducing the implant voltage by approximately 1.8 keV/$10^{17}$ ions/cm$^2$ applied. For example, if a normal dose of ions is approximately $1.6 \times 10^{18}$ ions/cm$^2$, a controlled reduction of approximately 28.8 keV over the period of implantation will result in a constant peak depth distribution at a level approximately 2850 A below the original top face of the silicon layer. This embodiment also allows processing time to be reduced from approximately five hours to approximately four hours.

Figure 4A:
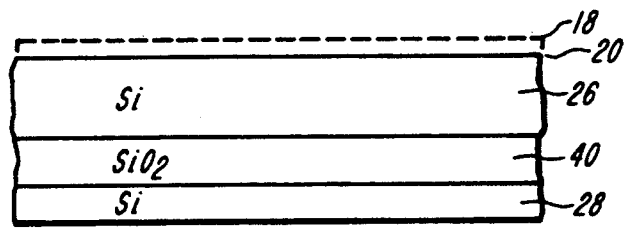
FIG. 4A is a diagrammatic representation of ion implantation for producing a widened buried insulating layer according to a second embodiment of the invention.
Figure 4B:
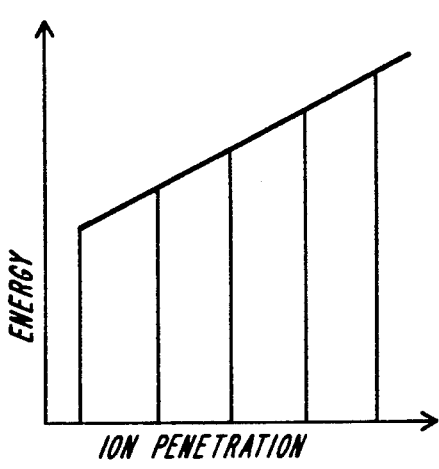
FIG. 4B is an energy profile diagram showing energy increasing with time according to the second embodiment of the invention.

In a second embodiment of the present invention, as shown in FIG. 4A, and using the same relationships regarding erosion rate and peak depth, the process described above is altered to form a thicker silicon dioxide band 40 by controllably increasing the beam energy used to implant ions. An increase in the beam energy, as illustrated in FIG. 4B, advantageously positions the peak distribution of ions at increasingly greater depths due to the combined effects of the increase in beam energy plus the surface erosion. For example, by increasing the beam energy from 150 keV to 170 keV over the course of an implantation cycle, the peak distribution depth of the implanted ions is increased from a level 2850 A below the original top face of the silicon layer to a level 3230° A below the eroded top face of the silicon layer. At a dose of $1.6 \times 10^{18}$ ions/cm$^2$, this eroded top face sits at a level 544 A lower than the original top face. Thus, the peak distribution of ions lies in a band ranging from 2850 A to 3774 A below the original top face of the silicon layer.

Figure 5:
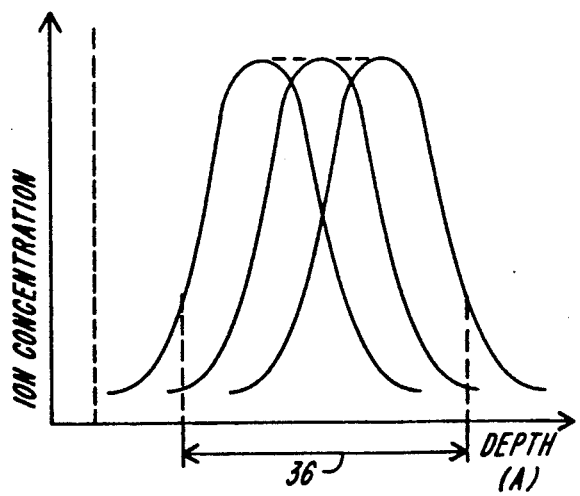
FIG. 5 is a graph showing the Gaussian distribution of the ions with respect to distance from the top face of the silicon layer in the second embodiment of the invention.

This second embodiment of the invention is further illustrated in FIG. 5 which shows the progressively deeper distribution curves in which the ions are implanted. This creates a far wider range 36 of distribution and a far wider insulating layer. This wide insulating layer supports a higher voltage for high voltage applications.

While the invention has been illustrated for oxygen implantation, it is to be understood that nitrogen or other implantable ions may be substituted. It will further be appreciated that the embodiments described are illustrative only and are not to limit the invention, the scope of which is defined only in the following claims.

I claim:

1. A process for producing a buried insulation forming implant layer disposed within a silicon substrate, comprising the steps of:
   implanting ions into a silicon substrate, from a source of controllable ion energy;
   simultaneously eroding a surface layer of said silicon substrate through which said implanting ions pass; and
   reducing the ion energy in compensation for erosion occurring in said eroding step to reduce the depth of ion penetration with respect to the surface erosion of said substrate.

2. The process of claim 1 wherein the silicon is of semiconductor grade.

3. The process of claim 1 wherein the implant is selected from the group comprising oxygen and nitrogen.

4. The process of claim 1 further including the step of annealing said substrate to create a continuous insulating layer from the implant layer.

5. A process for producing a buried insulation forming implant layer disposed with a silicon substrate, comprising the steps of:
   implanting ions into a silicon substrate from a source of controllable ion energy;
   simultaneously eroding a surface layer of said silicon substrate through which said implanting ions pass; and
   increasing the ion energy in compensation for erosion occurring in said eroding step to increase the depth of ion penetration with respect to the surface erosion of said substrate.

6. The process of claim 5 wherein the silicon is semiconductor grade.

7. The process of claim 5 wherein the implant is selected from the group consisting of oxygen and nitrogen.

8. The process of claim 5 which further includes the steps of annealing said substrate to create a continuous insulating layer from the implant layer.

* * * * *

UNITED STATES PATENT AND TRADEMARK OFFICE
CERTIFICATE OF CORRECTION

PATENT NO. : 5,080,730

DATED : January 14, 1992

INVENTOR(S) : Andrew B. Wittkower

It is certified that error appears in the above-identified patent and that said Letters Patent is hereby corrected as shown below:

On the Title page, item [56], above the Abstract, "Assistant Examiner-Ourmafd Ojan" should read --Assistant Examiner-Ourmazd Ojan--.

Column 1, line 33, "dioxide SiO$_2$)" should read --dioxide (SiO$_2$)--.

Column 2, line 43, "application" should read --applications--.

Column 3, line 55, "using constant" should read --using the prior art of Figs. 1A-1B where the beam energy remains constant--.

Column 4, line 6, "diagramatic" should read --diagrammatic--.

Column 4, line 12, "buried 9 silicon" should read --buried silicon--.

Column 4, line 31, "34/10$^{17}$ ions/cm$^2$" should read --34A/10$^{17}$ ions/cm$^2$--.

Column 4, line 37, "ions/cm$^2$ applied. For" should read --ions/cm$^2$. For--.

UNITED STATES PATENT AND TRADEMARK OFFICE
CERTIFICATE OF CORRECTION

PATENT NO. : 5,080,730

DATED : January 14, 1992

INVENTOR(S) : Andrew B. Wittkower

It is certified that error appears in the above-identified patent and that said Letters Patent is hereby corrected as shown below:

Column 6, line 24, "steps" should read --step--.

Signed and Sealed this

Twentieth Day of July, 1993

Attest:

MICHAEL K. KIRK

Attesting Officer     Acting Commissioner of Patents and Trademarks